US006559777B1

(12) United States Patent
Martin et al.

(10) Patent No.: US 6,559,777 B1
(45) Date of Patent: May 6, 2003

(54) DUAL MODE LIGHT SOURCE FOR AIRCRAFT EXTERNAL LIGHTING

(75) Inventors: John J. Martin, Gilbert, AZ (US); Cary H. Leach, Apache Junction, AZ (US)

(73) Assignee: L-3 Communications Corporation, New York, NY (US)

( * ) Notice: Subject to any disclaimer, the term of this patent is extended or adjusted under 35 U.S.C. 154(b) by 0 days.

(21) Appl. No.: 09/665,600

(22) Filed: Sep. 19, 2000

(51) Int. Cl.$^7$ .............................................. B64D 47/06
(52) U.S. Cl. ....................................... 340/981; 340/982
(58) Field of Search ................................ 324/556, 403, 324/414; 315/241, 300; 340/981, 982, 321; 362/470

(56) References Cited

U.S. PATENT DOCUMENTS

| | | | |
|---|---|---|---|
| 4,495,549 A | 1/1985 | Carlson et al. ................ 362/62 |
| 4,733,335 A | 3/1988 | Serizawa et al. .............. 362/80 |
| 5,632,551 A | 5/1997 | Roney et al. ................ 362/249 |
| 5,685,637 A | 11/1997 | Chapman et al. ........... 362/263 |
| 5,984,494 A | 11/1999 | Chapman et al. ........... 362/470 |
| 6,045,240 A | 4/2000 | Hochstein ................... 362/294 |
| 6,244,728 B1 | 6/2001 | Cote et al. .................. 362/249 |
| 6,268,702 B1 | 7/2001 | Fleck ...................... 315/185 R |
| 6,367,949 B1 | 4/2002 | Pederson .................... 362/240 |
| 6,375,340 B1 | 4/2002 | Biebl et al. ................. 362/294 |
| 2001/0030866 A1 | 10/2001 | Hochstein ................... 362/294 |
| 2002/0008976 A1 | 1/2002 | Gronemeier et al. ........ 362/545 |

FOREIGN PATENT DOCUMENTS

| | | |
|---|---|---|
| EP | 0 736 453 A2 | 10/1996 |
| WO | WO 98/21917 | 5/1998 |

*Primary Examiner*—N. Le
*Assistant Examiner*—Amy He
(74) *Attorney, Agent, or Firm*—Andrew L. Tiajoloff

(57) ABSTRACT

A dual mode light source unit is configured so that it can be secured into a conventional incandescent bulb socket on the aircraft. The light source has a connector portion that fits in the socket and receives the electrical current supplied thereto by the aircraft electrical system. The unit also comprises electric circuitry connected with the connector portion and a visible light source and an IR light source. The electric circuitry processes the input current from the socket and, based thereon, operates in either a civilian, visible mode or a covert IR mode. Where the current is in one electrical state, such as for example a certain voltage, the electric circuit sends power to the visible light source. When the current is in a different electrical state, e.g., a different voltage level, the circuitry sends power only to the IR source, and no visible light is emitted. Such a system allows for ready upgrade of existing aircraft because all control may be accomplished over a single pair of wires, as are already in existing aircraft wiring systems that do not have IR mode capability. To upgrade, light source units according to the invention can be simply inserted into the existing navigational light sockets.

67 Claims, 5 Drawing Sheets

DUAL MODE LIGHT SOURCE FOR AIRCRAFT EXTERNAL LIGHTING

FIELD OF THE INVENTION

This invention relates to navigation light sources provided for aircraft that are used to render the aircraft visible, and more particularly to navigation lights for military aircraft that may wish to exercise an option of going to a covert mode of operation in which the only light generated by the aircraft is infra red ("IR") light that can only be seen by friendly military wearing appropriate night vision goggles. The invention also relates to methods of upgrading the covert capabilities of existing aircraft that do not yet have covert IR navigational lights.

BACKGROUND OF THE INVENTION

The Federal Aviation Administration and the aviation authorities of many countries require that aircraft have navigational lighting generally red lights on the left side and green lights on the right side of the plane, to improve their visibility at night.

Military aircraft, when in civilian airspace on non-covert activities, are also required to have such lighting. Normally, the external lighting is provided by incandescent light bulbs in sockets on the outside of the plane. These are conventionally powered by electricity from the internal electronics of the aircraft, which in most U.S. fighter aircraft is 400 Hz AC at 115 volts. A single double wire runs to each light bulb. The pilot can adjust the intensity of the navigation lights or turn them off completely with a brightness control dial in the cockpit which varies the voltage of the AC current sent to the light socket. In situations where visibility would be a disadvantage, these military aircraft would in the past simply turn off the external lighting.

In recent years, it was noted that in covert activities the aircraft was not visible to the enemy, but also not visible to friendly aircraft, and planes began to be supplied with covert mode IR light sources in addition to the visible navigational lights. The IR light emitted is not visible to the human eye, but can be seen with appropriate viewing equipment, e.g., night vision goggles.

To upgrade aircraft to covert IR capability, IR light sources of this type have ordinarily been additional arrays of IR diodes added to the outside of the plane in addition to the existing navigational lights. Alternatively, filters have been mounted over the existing navigational lights and IR diodes mounted in the light bulb fixtures. These kinds of additions, however, require substantial structural work to create the mounts and to wire the new fixtures into the aircraft body, which usually does not have very much extra room for more wiring. In addition, the extensive modifications result in considerable expense for an upgrade to covert IR capability.

SUMMARY OF THE INVENTION

It is accordingly an object of the invention to provide an aircraft lighting system that can function both as a visible navigational light system and also as a covert IR light system for friendly eyes only. It is also an object of the invention to provide a design and method that allows for relatively easy upgrade of existing visible navigation lights to give an existing aircraft IR covert capability without the need for any substantial mechanical adaptation of the plane's structure.

These and other objectives are accomplished by providing according to the invention a dual mode light source unit configured so that it can be secured into a conventional incandescent bulb socket on the aircraft. The light source has a connector portion that fits in the socket and receives the electrical current supplied thereto by the aircraft electrical system. The unit also comprises electric circuitry connected with the connector portion and a visible light source and an IR light source.

The electric circuitry is configured to process the input current from the socket and based thereon, operate in either a civilian visible mode or a covert IR mode. Where the current is in one electrical state, such as for example a certain voltage, the electric circuit sends power to the visible light source. When the current is in a different electrical state, e.g., a different voltage level, the circuitry sends power only to the IR source and no visible light is emitted. The electrical states of the current may be any variation of electrical parameters thereof, including amperage, voltage, frequency, or data encoded therein, etc.

Such a system allows for ready upgrade of existing aircraft because all control may be accomplished over a single pair of wires, as are already in existing systems that do not have IR mode capability. To upgrade, light source units according to the invention are simply inserted into the existing navigational light sockets.

Other objects and advantages of the invention will become apparent from the specification herein.

DETAILED DESCRIPTION

Figure 1:
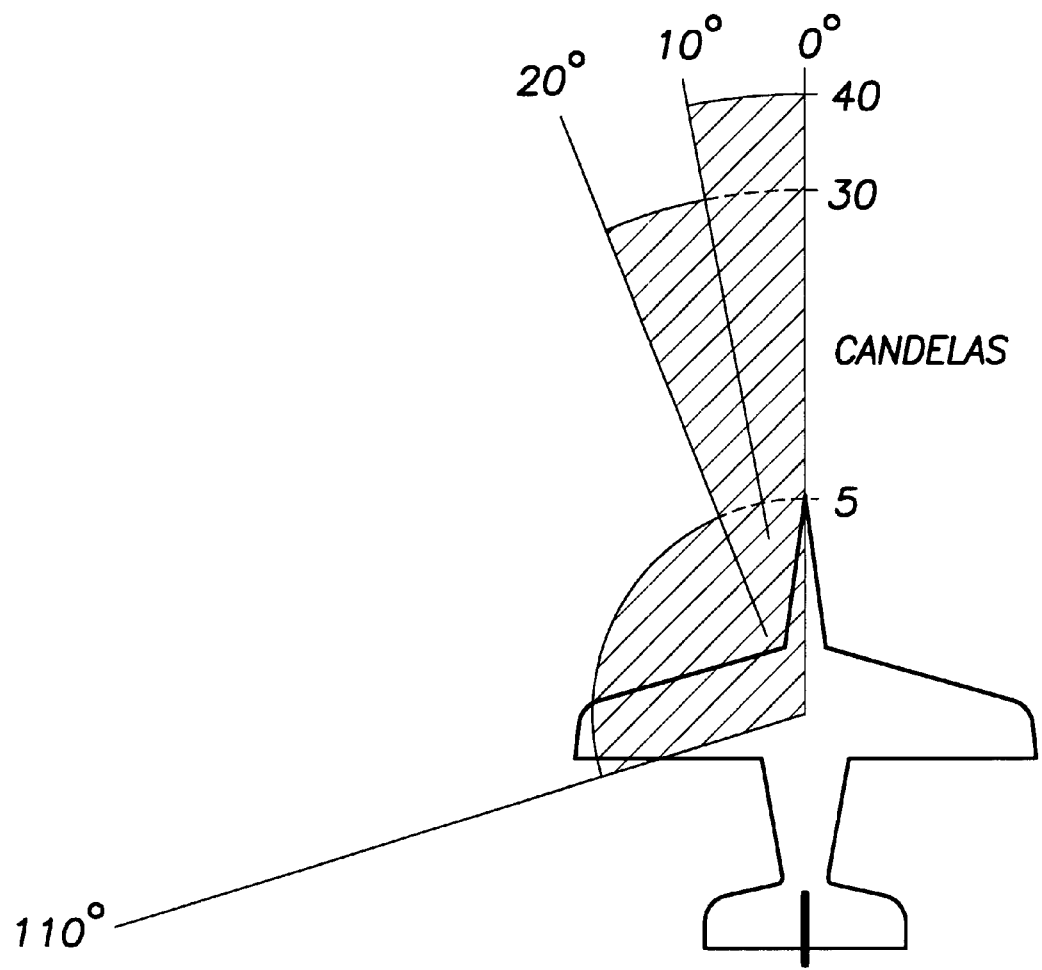
FIG. 1 shows a schematic top view of an aircraft graphically illustrating one of the placements for a navigational light and showing the required light intensity in varying angles, as required by the FAA.

Referring to FIG. 1, all aircraft flying in civilian airspace are required to be equipped with visible navigational lights to allow them to see each other at night or in conditions of bad visibility. The FAA has defined the parameters for acceptable navigational light intensity based on the angle of viewing thereof. A navigational light on top of an aircraft must project at least 40 candelas luminous intensity directly ahead, i.e. zero degrees and in a 10-degree angular spread to the side of the plane. Between 10 and 20 degrees off the nose of the plane, 30 candelas luminous intensity are required. Between 20 and 110 degrees, an illumination of only 5 candelas is required.

Military aircraft are also required to have such visible navigation lighting systems for operation in civilian areas in a non-covert, visible mode. Accordingly, even military aircraft are equipped with a number of navigational lights, which have traditionally been incandescent bulbs. For each bulb, the aircraft has an electric bulb socket, usually the type of socket that is referred to as a bayonet socket, which is wired into the aircraft's electrical system. The socket is configured to receive and secure a bulb therein and make an electrical contact with it. Power from the electronic system of the aircraft is then supplied through the socket.

Normally, the pilot has a brightness control dial or similar control device in the cockpit that allows him to adjust the brightness of the external navigational lights up or down. Adjusting this control dial in prior art systems changes the voltage of the 400 Hz AC current sent to the bulb over the plane's internal electrical wiring.

Figure 2:
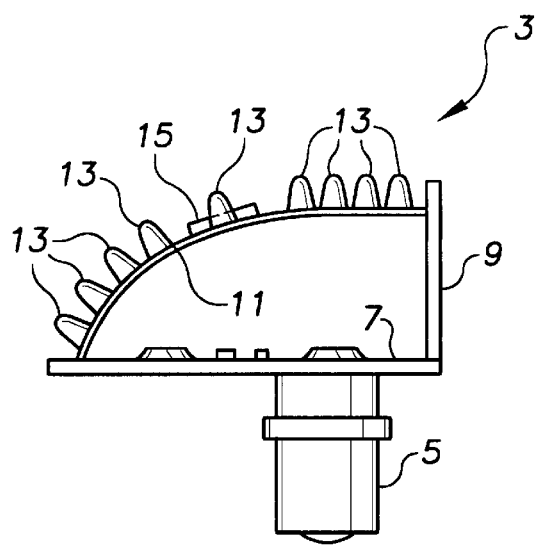
FIG. 2 shows a side view of the dual mode light source unit of the present invention.

As best seen in FIG. 2 the dual mode light source unit 3 comprises a connection portion 5 which is preferably a standard single-contact bayonet base, which is configured to fit in and connect with a standard bayonet socket for an incandescent bulb in the aircraft. When secured in the bayonet socket, connection portion 5 makes the necessary contacts and receives the control current from the aircraft electrical system in the same way as the incandescent bulbs of the prior art.

The electrical current received is transmitted to electronic circuitry in the form of circuit board 7 mounted fixedly on connection portion 5 and double-sided copper circuit board 9 fixedly attached to circuit board 7 and extending upwardly therefrom. Connected with both boards 7 and 9 is light source mounting board 11, made of thin flex circuit board and supporting the light emitting components of the unit.

Figure 3:
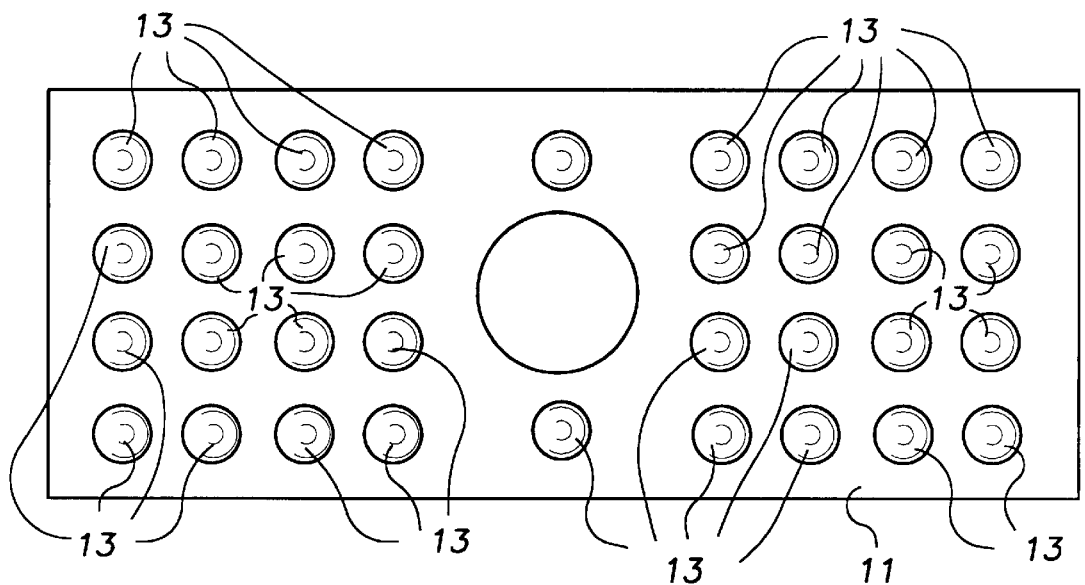
FIG. 3 shows a front view of the LED mounting board used in the unit, showing the arrangement of the LEDs and the IR emitter thereon before it is flexed into position in the unit.

As best seen in FIG. 3, the thin flex board 11 has an array of components secured thereto. The board 11 supports a visible light source in the form of thirty-four (34) visible light-emitting diodes 13 or LEDs (3500 MCD) mounted thereon, in two 4×4 arrays and one on either side of IR light source 15. These LEDs 13 are wired in parallel and connected to board/to receive power therefrom, as is IR source 15. A different number of LEDs may be used as required, and also, alternatively, other array configurations may be used to achieve the required luminous intensity distribution as well, especially if LEDs specified in the preferred embodiment are used.

The near-infrared emitter 15 is preferably an emitter such as the super light-power GaAlAs IR emitter sold as model no. OD 50W by the Opto Diode Corp., of Newbury Park, Calif. The preferred IR emitter generates IR at a range of wavelengths centered at about 880 nm, and with a fairly wide angular spread, necessitating only a single emitter for each unit. However, more than one IR emitter may be used, optionally supported in several orientations relative to each other. Night vision goggles used in covert operations are particularly sensitive to the deep red and near-infrared region of the spectrum, and friendly military equipped with night vision goggles are readily able to see the IR produced by the IR emitter 15. Without appropriate night vision equipment, however, the IR light is impossible to see.

The LEDs are selected and configured to emit light conforming to FAA luminous intensity requirements, angular coverage requirements, and chromaticity requirements for Aviation Red or Aviation Green. All of the LEDs for a given light unit are either red or green, depending on whether the unit is to be installed on the left-hand (red) or the right-hand (green) side of the aircraft. The LEDs are high intensity directional LEDs, such as those manufactured by Purdy Electronics of Sunnyvale, Calif., with Model number AND180HSP, Motorola, Inc., with Model number HSMC S690, or Nichia Corporation of Japan as model number NSPG-510S, or equivalent products. LEDs of this type generally project fairly intense light only within a cone of about 10 to 15 degrees. To meet the FAA requirements for an angular spread of luminous intensity levels as shown in FIG. 1, the board is bowed, as seen in FIG. 2, so that the LEDs point in a plurality of angled directions and achieve the luminous intensity distribution required.

The LEDs generate visible light, but unlike incandescent lights, which are copious emitters of near-infrared energy at any brightness setting the LEDs are selected for having spectral emission characteristics such that they do not generate much, if any, infrared light. As a consequence, these LEDs will not overpower or unduly degrade an intensified image of the LED when viewed at close range using night vision goggles.

The dual mode light source is configured to be installed by simply substituting the dual mode light source unit for an existing navigation light bulb. The shape, volume, power requirements, and external physical configuration of the dual mode unit of the disclosed embodiment are substantially the same as for the Grimes type 72914/11631, a 6.2-volt, 40-watt incandescent bulb. It will be understood however that virtually any type of light source might be replaced by a suitably configured dual mode light source unit according to the invention.

The electronics of the dual mode unit are preferably set up to interface with the electronic current supplied by the aircraft electrical system so that no further modification is necessary, and covert mode or visible mode may be selected by the pilot by the dimmer control already present for the navigational lights.

In most current navigation light systems which provide for adjusting the brightness of the navigation lights, the control of the brightness is effectuated by varying the voltage of the AC power current sent to the light between a minimum value of about five volts and a maximum value of about 115 volts. According to an aspect of the present invention, this varying voltage control is used to give a pilot control over whether the aircraft is operating in visible civilian mode, or covert IR mode.

Figure 4:
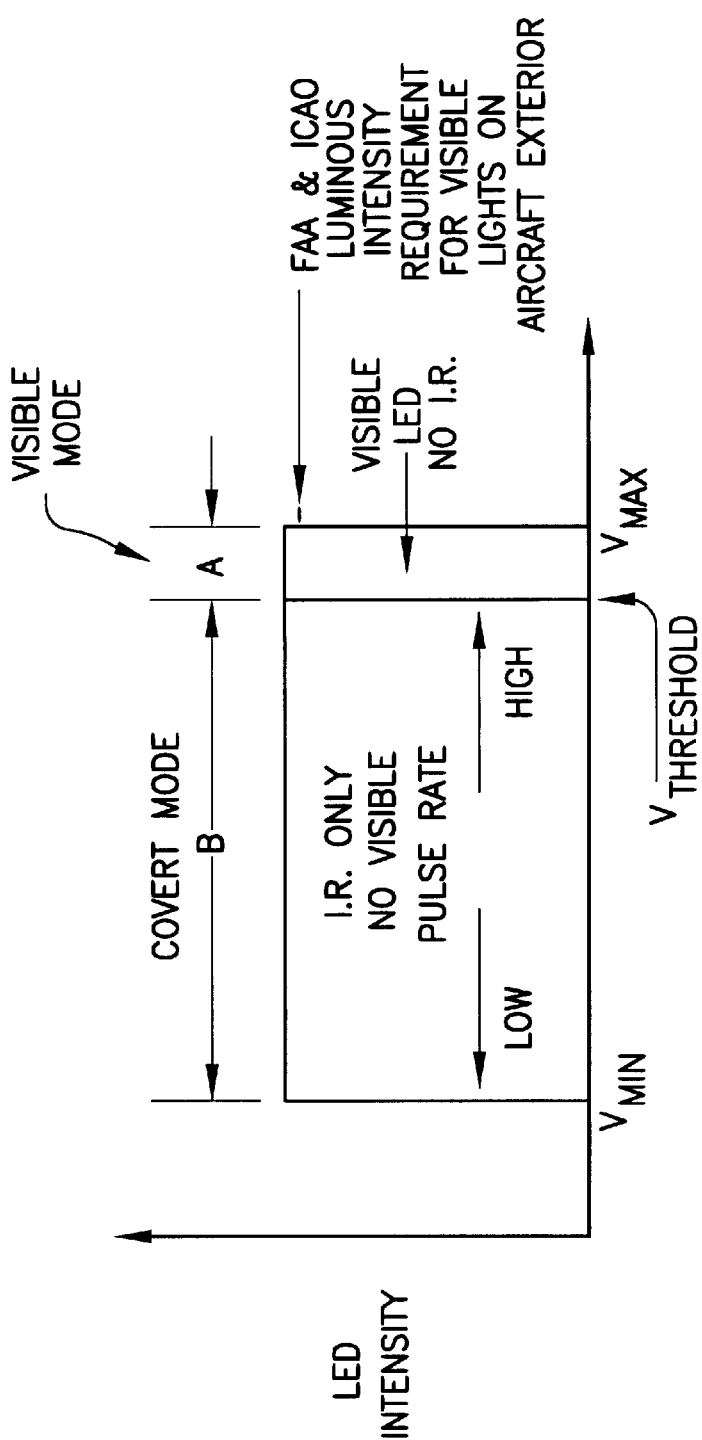
FIG. 4 is a graphical illustration of the operation of a typical installation of the dual mode unit of the invention.

FIG. 4 illustrates the functionality of the electronic circuitry 7 of the unit 3. The circuitry analyses the incoming current from the aircraft, and if the voltage exceeds a preselected threshold voltage $V_{threshold}$, the dual mode unit is placed in visible mode, and only the visible LEDs are illuminated. No power is sent to the IR light source. The intensity of the visible LEDs remains constant irrespective of any changes to different voltages in this range of voltages A.

To enter covert mode, the pilot needs only to turn the existing navigation light brightness control down low enough, thereby reducing the input voltage to the unit. When the unit's electronics detect that the input voltage has dropped below the threshold voltage, the dual mode unit shifts to covert mode; all power is cut to the visible light source (the LEDs 13), and power is sent to illuminate the IR light source.

The IR light source is fed a constant level of power over the entire range B of voltages from $V_{min}$ to the threshold voltage. However, it is desirable, where a number of aircraft are flying covert mode and viewing each other's IR emissions through their night vision goggles, that the IR have a distinctive appearance for some or all of the aircraft. This can be accomplished in the present system by causing the IR light source to pulse on and off periodically so that individual aircraft will have a recognizable cycle or "blink rate" to the pulse of their IR. Adjustment of the voltage by the pilot in this voltage range B results in adjustment of the periodic frequency of the pulsing of the IR emission on the aircraft. Higher voltages result in faster pulsing, and reducing the input voltage slows down the IR pulsing rate. The pulse is preferably a square wave, and in the preferred embodiment the square wave keeps the IR source on about 75% of the time.

Figure 5:
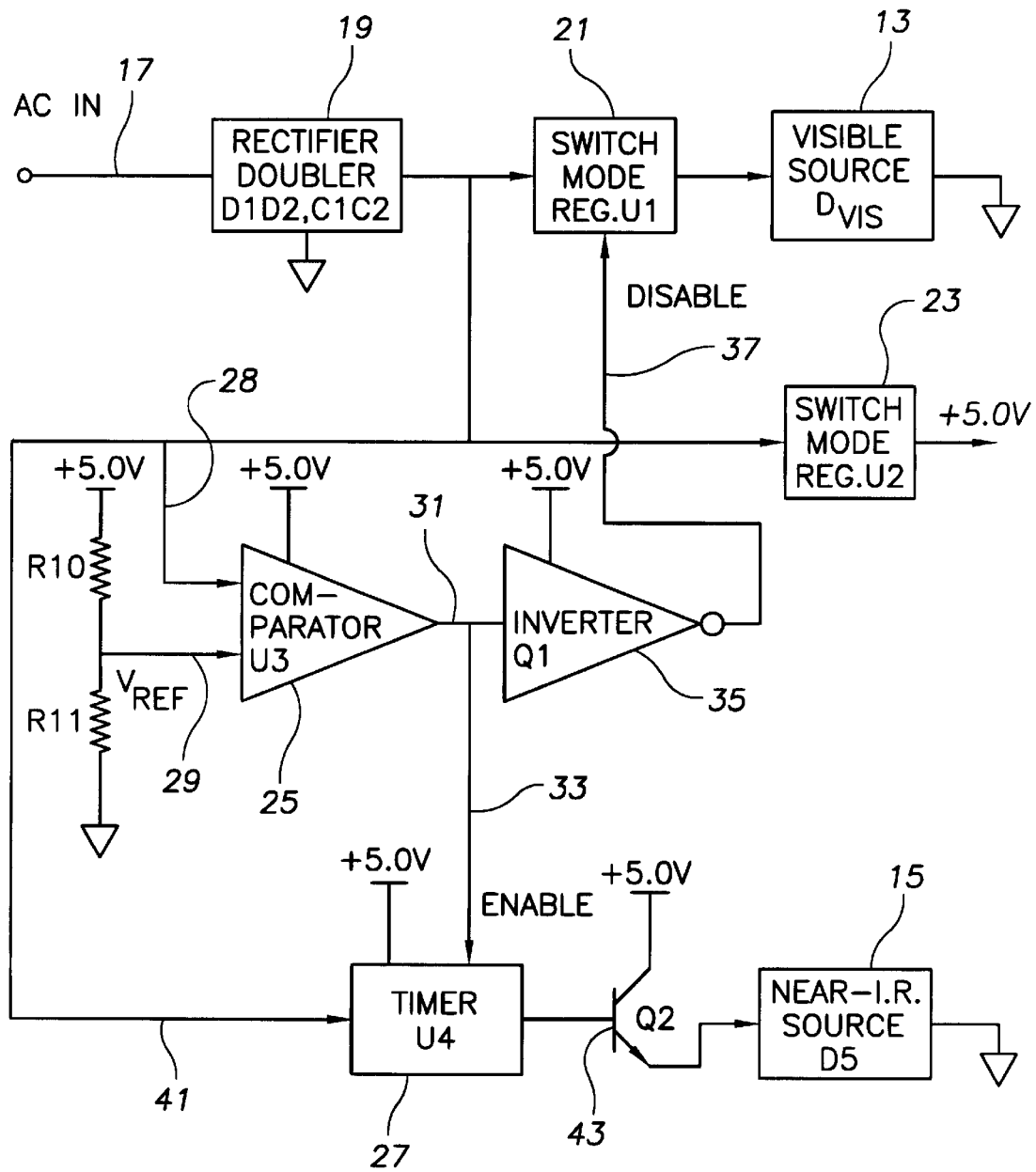
FIG. 5 is a functional diagram of the electronic circuitry of the dual mode light source unit.
Figure 6:
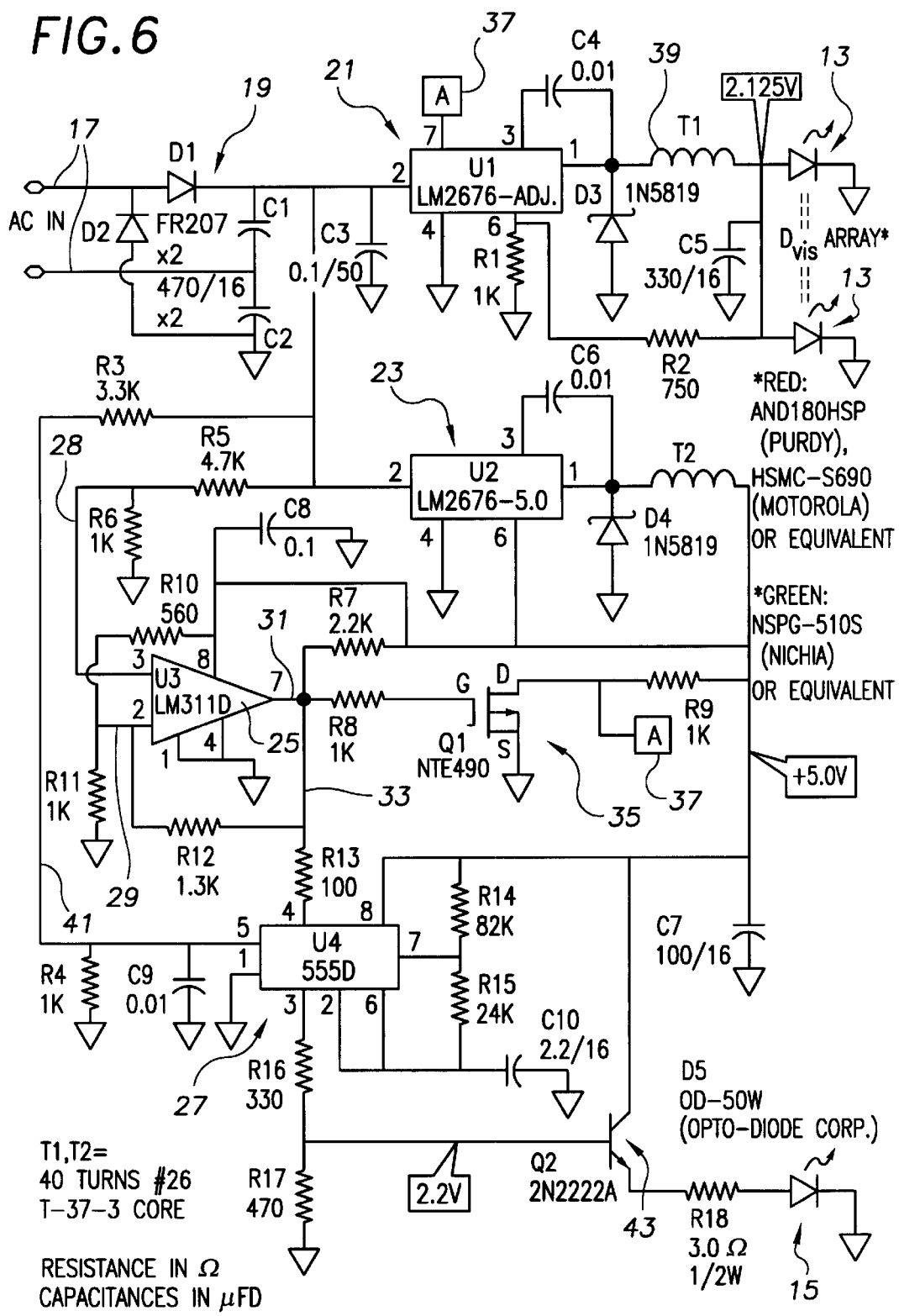
FIG. 6 is a more detailed schematic of the circuitry of the dual mode light source unit.

The operation of the electronic circuitry of the dual mode unit is illustrated best in FIG. 5. The schematic of FIG. 6 parallels FIG. 5, but shows the individual components in greater detail. Equivalent parts are indicated by the same reference number in the figures.

The input AC power current is introduced from the socket connector base through line 17, which feeds the current into rectifier doubler 19, which converts the AC to equivalent voltage DC current. This DC current is delivered to the visual light source (LEDs 13) through visual mode switch 21, to switch mode voltage regulator 23, which converts the variable voltage current to a steady DC output, and also to voltage comparator 25, which determines the mode of the unit, and to IR light source 15 through switchable control mode timer circuitry 27.

The determination of which mode the unit is to be in is made at comparator 25, which receives the input voltage along line 28 and compares this input voltage to a preset reference voltage from line 29 from a divider network which corresponds to the threshold voltage for the change between covert and visible modes. This reference voltage in the preferred embodiment is about 5.8 volts, although this threshold value could vary considerably. If the input current 13 is in an electrical state indicating visible mode (e.g., voltage higher than threshold) the comparator output 31 snaps to low. This low voltage is sent by line 33 to switchable timer 27 for the IR light source, and switches it off so no power goes to the IR light source. The low output on line 31 is also inverted by inverter 35, and this high output is sent via line 37 to turn on the switching regulator 21, allowing the constant DC current to flow through to the visible light source LEDs 13. The LEDs thus remain at a constant intensity despite any variations in input voltage at this level.

If the input current is in an electrical state that indicates covert mode (e.g., voltage below threshold, range B in FIG. 4), then the comparator 25 produces an output that snaps to high. This high output is inverted by inverter 35 to produce a low signal to the switch mode regulator 21, cutting the flow of power to the visual light source. At the same time, the high output on line 31 switches timer 27 on.

When switched on, timer 27 acts as a voltage controlled oscillator, and the high output 33 applied thereto runs it in an astable mode, oscillating at a frequency based on the voltage applied thereto along line 41, with higher frequency oscillating produced by higher input voltage. This rate of oscillation is in a range that can be seen by the human eye, and provides the adjustable blink rate for the IR light source based on the pilot-controlled level of input voltage.

The output of the oscillation of the timer goes to a follower 43 and causes it to switch a 5 volt power supply to the IR light source on and off responsive thereto. The resulting pulsing current flows to IR source 15 and causes it to pulse periodically. Since the rate of pulsing IR is dependent on the input voltage, it can be adjusted by also adjusting the input current voltage by adjusting the cockpit brightness control in the lower range that corresponds to covert mode.

An existing aircraft with variable brightness control for its navigational lights can be upgraded to an infrared covert capability by substituting a dual mode light source unit for each of the incandescent navigation light bulbs thereof. When this is done, existing brightness controls may be used to operate in visual or covert mode as follows.

In normal civilian airspace, the pilot illuminates the navigation lights by setting the brightness control at a high setting corresponding to a voltage above the threshold at the sockets. When covert operation is desired, the pilot dials down the brightness control until the visible navigation lights go out. If the pilot puts on night vision goggles, he will see the IR emitters blinking at a certain rate. He can adjust this rate to be slower by further dialing down the brightness control. The settings for specific recognizable pulsing rates may be incorporated into the control as desired to aid in coordination of the speed of pulsing between aircraft.

New aircraft may also be equipped with dual mode light sources according to the invention with substantial benefits as well. The dual mode unit has an enhanced lifetime over that of incandescent bulbs, and also obtains an advantage over separate visible/IR systems by use of only a single wire pair for control of both types of light, reducing labor and cost of manufacture, and to a degree, weight of the aircraft.

It will be understood that the invention herein extends well beyond the embodiments of the disclosure, and the terms used in this specification should be understood to be language of description, not limitation, as those of skill in the art with this specification before them will be able to make changes and modifications therein without departing from the scope of the invention.

What is claimed is:

1. A dual mode light unit for an aircraft, said unit comprising:
    a light control circuitry configured to be operatively connected with wiring connecting with pilot interface circuitry and to receive an alternating electrical current therefrom,
    a visible navigational light source connected with the light control circuitry, and
    an infrared light source connected with the light control circuitry,
    said light control circuitry, when the alternating electrical current is at a first voltage, supplying power to the visible navigational light source and, when the alternating electrical current is at a second voltage, supplying power to the infrared light source and limiting power going to the visible light source so as to cause the visible light source to produce substantially no visible light.

2. The dual mode light unit of claim 1 wherein the unit includes a connector base structure connected with the light control circuitry between said light control circuitry and the wiring of the aircraft.

3. The dual mode light unit of claim 2 wherein the connector base structure is configured to be received in a socket on the aircraft and to receive the alternating electrical current through the socket.

4. The dual mode light unit of claim 2 wherein the connector base structure is configured to be received in a bayonet socket on the aircraft and to receive the alternating electrical current therefrom.

5. The dual mode light unit of claim 1 wherein the IR light source comprises a solid state infrared emitter.

6. The dual mode light unit of claim 1 wherein said visible light source comprises a set of LEDs connected with the light control circuitry.

7. The dual mode light unit of claim 6 wherein
    the unit includes a connector base structure connected with the light control circuitry between said light control circuitry, and the connector base structure is configured to be received in a socket on the aircraft and to receive the alternating electrical current through the socket.

8. The dual mode light unit of claim 6 wherein said LEDs in the visible mode either all generate red light or all generate green light.

9. The dual mode light unit of claim 1 wherein said visible light source comprises a set of LEDs, and the LEDs are directional and supported in a plurality of different angular orientations so as to project a spread of light therefrom.

10. The dual mode light unit of claim 9 wherein
   the unit includes a connector base structure connected with the light control circuitry between said light control circuitry, and
   the connector base structure is configured to be received in a socket on the aircraft and to receive the alternating electrical current through the socket.

11. The dual mode light unit of claim 1 wherein the light control circuitry switches off power to the visible navigational light source when the alternating electrical current is at the first voltage.

12. The dual mode light unit of claim 11 wherein
   the unit includes a connector base structure connected with the light control circuitry between said light control circuitry, and
   the connector base structure is configured to be received in a socket on the aircraft and to receive the alternating electrical current through the socket.

13. The dual mode light unit of claim 1 wherein the visible navigational light source comprises a set of LEDs and the infra-red light source comprises a solid state infra-red emitter, the power supplied to the LEDs and the infra-red emitter being DC current derived from the alternating electrical current received from the wiring connecting with the pilot interface circuitry.

14. The dual mode light unit of claim 13 wherein the DC current supplied to the LEDs is derived using a first voltage regulator and the DC current supplied to the infra-red emitter being derived using a second voltage regulator.

15. The dual mode light unit of claim 14 wherein the DC current supplied to the LEDs is derived using a first voltage regulator and the DC current supplied to the infra-red emitter being derived using a second voltage regulator.

16. The dual mode light unit of claim 15 wherein
   the unit includes a connector base structure connected with the light control circuitry between said light control circuitry, and
   the connector base structure is configured to be received in a socket on the aircraft and to receive the alternating electrical current through the socket.

17. The dual mode light unit of claim 14 wherein
   the unit includes a connector base structure connected with the light control circuitry between said light control circuitry, and
   the connector base structure is configured to be received in a socket on the aircraft and to receive the alternating electrical current through the socket.

18. The dual mode light unit of claim 13 wherein
   the unit includes a connector base structure connected with the light control circuitry between said light control circuitry, and
   the connector base structure is configured to be received in a socket on the aircraft and to receive the alternating electrical current through the socket.

19. The dual mode light unit of claim 1 wherein the light control circuitry comprises a rectifier receiving and converting the alternating electrical current to a direct current having a voltage varying dependent on the voltage of the alternating electrical current, said light control circuitry determining that the alternating current is at the first voltage or the second voltage by comparing the voltage of the direct current to a reference voltage.

20. The dual mode light unit of claim 19 wherein the light control circuitry further comprises a voltage regulator producing a DC current at the reference voltage, said current being derived from the alternating electrical current.

21. The dual mode light unit of claim 20 wherein
   the unit includes a connector base structure connected with the light control circuitry between said light control circuitry, and
   the connector base structure is configured to be received in a socket on the aircraft and to receive the alternating electrical current through the socket.

22. The dual mode light unit of claim 19 wherein
   the unit includes a connector base structure connected with the light control circuitry between said light control circuitry, and
   the connector base structure is configured to be received in a socket on the aircraft and to receive the alternating electrical current through the socket.

23. The dual mode light unit of claim 1 wherein the light control circuitry, when the alternating electrical current is at the second voltage, switches the power to the infra-red light source on and off so that the infra-red light source pulses.

24. The dual mode light unit of claim 23 wherein the light control circuitry, when the alternating electrical current is at a third voltage different from said first and second voltages, limits power going to the visible light source such that the visible light source produces substantially no visible light, and pulses power to the infrared light source such that said infrared light sources pulses differently from the pulsing thereof when the alternating current is at the second voltage.

25. The dual mode light unit of claim 24 wherein the infrared light sources pulses periodically at a first frequency when the alternating current is at the second voltage and at a second frequency when the alternating current is at the third voltage.

26. The dual mode light unit of claim 25 wherein
   the unit includes a connector base structure connected with the light control circuitry between said light control circuitry, and
   the connector base structure is configured to be received in a socket on the aircraft and to receive the alternating electrical current through the socket.

27. The dual mode light unit of claim 24 wherein the first voltage is higher than the second voltage.

28. The dual mode light unit of claim 27 wherein
   the unit includes a connector base structure connected with the light control circuitry between said light control circuitry, and
   the connector base structure is configured to be received in a socket on the aircraft and to receive the alternating electrical current through the socket.

29. The dual mode light unit of claim 24 wherein
   the unit includes a connector base structure connected with the light control circuitry between said light control circuitry, and
   the connector base structure is configured to be received in a socket on the aircraft and to receive the alternating electrical current through the socket.

30. The dual mode light unit of claim 23 wherein
the unit includes a connector base structure connected with the light control circuitry between said light control circuitry, and
the connector base structure is configured to be received in a socket on the aircraft and to receive the alternating electrical current through the socket.

31. A dual mode light unit for an aircraft, said unit comprising:
a light control circuitry configured to be operatively connected with wiring connecting with pilot interface circuitry and to receive an alternating electrical current therefrom,
a visible navigational light source connected with the light control circuitry, and
an infrared light source connected with the light control circuitry,
said light control circuitry, when the alternating electrical current is at a first voltage, supplying power to the visible navigational light source, and
the light control circuitry, where the current is lower than a preselected threshold voltage level, operating the dual mode light unit in a covert mode wherein no power is supplied to the visible light source and the light unit generates no visible light, and power is supplied to the infrared light source.

32. The dual mode light unit of claim 31, wherein
the light control circuitry includes circuitry detecting whether the current is above a preselected threshold voltage level, and responsive to such a detection, said circuitry causes the light unit to operate in a visible mode wherein power is supplied to the visible light source.

33. The dual mode light unit of claim 32 wherein
the unit includes a connector base structure connected with the light control circuitry between said light control circuitry, and
the connector base structure is configured to be received in a socket on the aircraft and to receive the alternating electrical current through the socket.

34. The dual mode light unit of claim 31 wherein
the unit includes a connector base structure connected with the light control circuitry between said light control circuitry, and
the connector base structure is configured to be received in a socket on the aircraft and to receive the alternating electrical current through the socket.

35. An external lighting system for an aircraft, said system comprising:
wiring connecting a pilot control with a plurality of sockets configured to receive therein visible navigation lights, adjustment of the control causing variation in voltage of a current supplied through the sockets;
each of said sockets retaining therein a dual mode light unit comprising
a socket connector secured in the socket,
a light control circuitry operatively connected with the socket connector and receiving therefrom the current from the socket,
a visible navigational light source connected with the light control circuitry and including a set of directional LEDs supported on a mounting structure in a plurality of different angular orientations so as to project a spread of light therefrom of at least about 110 degrees,
a near-red infrared light source connected with the light control circuitry and including an infrared light emitter, the light control circuitry including circuitry detecting whether the current is above a preselected threshold voltage level, and responsive to such a detection causes the light unit to operate in a visible mode wherein power is supplied to the visible light source, and
the light control circuitry, where the current is lower than said threshold voltage level, operating the dual mode light unit in a covert mode wherein the light unit generates no visible light and power is supplied to the infrared light source.

36. The system of claim 35 and said light control circuitry causing the infrared light source to pulse at a periodic rate.

37. The system of claim 36 wherein the periodic rate of the pulsing of the infrared light source is dependent on the voltage of the current.

38. The system of claim 35 wherein said current supplied through the sockets is an alternating current.

39. A method of giving-infrared capability to an aircraft having a navigational light thereon supported in a socket on a body of the aircraft, said socket being connected with wiring supplying electric current to the navigational light, the current being in one of a plurality of electrical states, the aircraft having a pilot-accessible control therein responsive to which the pilot can selectively cause the current to change to a different electrical state for adjusting brightness of the navigation light, said method comprising:
removing the navigational light from the socket; and
inserting in said socket a dual mode light unit for an aircraft, said unit comprising:
a connector base structure is configured to be received in the socket on the aircraft and to receive electric current through the socket,
a light control circuitry configured to be operatively connected with the base structure so as to receive an electrical current therefrom,
a visible navigational light source connected with the light control circuitry, and
an infrared light source connected with the light control circuitry,
said light control circuitry, when the electrical current is in a first electrical state, supplying power to the visible navigational light source and, when the electrical current is in a second state, supplying power to the infrared light source and causing the visible light source to produce substantially no visible light.

40. The method of claim 39 wherein the socket is a bayonet socket.

41. The method of claim 39 wherein the light control circuitry is configured to receive current having a varying voltage, said first and second electrical states of the current being first and second voltages thereof.

42. The method of claim 39 wherein the IR light source comprises a solid state infrared emitter.

43. The dual mode light unit of claim 42 wherein the light control circuitry is configured to receive AC current having a varying voltage up to about 115 volts.

44. The method of claim 39 wherein the light control circuitry causes the infrared light source to pulse at a first frequency.

45. The method of claim 44 wherein the light control circuitry, responsive to the current being in a third electrical state, causes the infrared light source to pulse at a second frequency different from the first frequency.

46. The method of claim 45 wherein the light control circuitry is configured to receive current having a varying voltage, said first, second, and third electrical states of the current being respective voltages thereof.

47. The method of claim 39 wherein said visible light source comprises a set of LEDs supported on a mounting structure.

48. The method of claim 47 wherein the LEDs are directional and supported in a plurality of different angular orientations so as to project a spread of light therefrom.

49. The method of claim 39, and the light control circuitry including circuitry detecting whether the current is above a preselected threshold voltage level, and responsive to such a detection causing the light unit to operate in a visible mode wherein power is supplied to the visible light source.

50. The method of claim 39, and the light control circuitry, where the current is lower than a preselected threshold voltage level, operating the dual mode light unit in a covert mode wherein the light unit generates no visible light and power is supplied only to the infrared light source.

51. A dual mode light unit for an aircraft, said unit comprising:
    a light control circuitry configured to be operatively connected with wiring connecting with pilot interface circuitry so as to receive an electrical current therefrom,
    a visible navigational light source connected with the light control circuitry, and
    an infrared light source connected with the light control circuitry,
    said light control circuitry, when the electrical current is in a first electrical state, supplying power to the visible navigational light source and, when the electrical current is in a second electrical state or a third electrical state, supplying power to the infrared light source and causing the visible light source to produce substantially no visible light, and
    the light control circuitry causing the infrared light source to pulse responsive to the current being in the second electrical state or the third electrical state, said light control circuitry causing the infrared light source to pulse differently when the current is in the second electrical state as compared to when the current is in the third electrical state.

52. The dual mode light unit of claim 51 wherein the unit includes a connector base structure connected with the light control circuitry between said light control circuitry and the wiring of the aircraft.

53. The dual mode light unit of claim 52 wherein the connector base structure is configured to be received in a socket on the aircraft and to receive the electrical current through the socket.

54. The dual mode light unit of claim 53 wherein said visible light source comprises a set of LEDs connected with the light control circuitry.

55. The dual mode light unit of claim 52 wherein said visible light source comprises a set of LEDs connected with the light control circuitry.

56. The dual mode light unit of claim 51 wherein the IR light source comprises a solid state infrared emitter.

57. The dual mode light unit of claim 56 wherein said visible light source comprises a set of LEDs connected with the light control circuitry.

58. The dual mode light unit of claim 56 wherein said visible light source comprises a set of LEDs, and the LEDs are directional and supported in a plurality of different angular orientations so as to project a spread of light therefrom.

59. The dual mode light unit of claim 56 wherein the light control circuitry is configured to receive current having a varying voltage, said first, second and third electrical states of the current being first, second and third voltages thereof.

60. The dual mode light unit of claim 56 wherein the light control circuitry is configured to receive AC current having a varying voltage and wherein said first, second and third electrical states of the current being first, second and third voltages of said AC current.

61. The dual mode light unit of claim 60 wherein the power supplied to the visible navigational light source and the infrared light source is derived from the AC current.

62. The dual mode light unit of claim 51 wherein said visible light source comprises a set of LEDs connected with the light control circuitry.

63. The dual mode light unit of claim 51 wherein said visible light source comprises a set of LEDs, and the LEDs are directional and supported in a plurality of different angular orientations so as to project a spread of light therefrom.

64. The dual mode light unit of claim 51 wherein the light control circuitry is configured to receive current having a varying voltage, said first, second and third electrical states of the current being first, second and third voltages thereof.

65. The dual mode light unit of claim 51 wherein the light control circuitry is configured to receive AC current having a varying voltage and wherein said first, second and third electrical states of the current being first, second and third voltages of said AC current.

66. The dual mode light unit of claim 51 wherein the light control circuitry causes the infrared light source to pulse at a first frequency responsive to the current being in the second electrical state.

67. The dual mode light unit of claim 66 wherein the light control circuitry, responsive to the current being in the third electrical state, causes the infrared light source to pulse at a second frequency different from the first frequency.

* * * * *